(12) United States Patent
Neumann et al.

(10) Patent No.: US 9,326,430 B2
(45) Date of Patent: Apr. 26, 2016

(54) DEVICE FOR COOLING AN ELECTRONIC COMPONENT IN A DATA CENTER

(75) Inventors: Matt Neumann, Roseville, CA (US); Timothy Michael Rau, Meridian, ID (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 106 days.

(21) Appl. No.: 14/350,066

(22) PCT Filed: Oct. 26, 2011

(86) PCT No.: PCT/US2011/057874
§ 371 (c)(1),
(2), (4) Date: Apr. 4, 2014

(87) PCT Pub. No.: WO2013/062539
PCT Pub. Date: May 2, 2013

(65) Prior Publication Data
US 2014/0268549 A1    Sep. 18, 2014

(51) Int. Cl.
*H05K 7/20* (2006.01)
*H01L 23/473* (2006.01)

(52) U.S. Cl.
CPC ........ *H05K 7/20781* (2013.01); *H05K 7/20709* (2013.01); *H05K 7/20736* (2013.01); *H05K 7/20772* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS 7,333,330 B2    2/2008    McEwan
7,599,184 B2    10/2009   Upadhya et al.
(Continued)

FOREIGN PATENT DOCUMENTS

WO    WO-2010036199    4/2010

OTHER PUBLICATIONS

EPO, Supplementary European Search Report, mailed Oct. 19, 2015, App. No. 11874616.3.
(Continued)

*Primary Examiner* — Anthony Haughton
*Assistant Examiner* — Razmeen Gafur
(74) *Attorney, Agent, or Firm* — Wagner Blecher, LLP

(57) ABSTRACT

A device for cooling an electronic component in a data center is provided. The device includes a closed loop, a first area, a second area, and a barrier. The closed loop includes a first portion and a second portion. The liquid flows around the closed loop. The first area is configured for dissipating heat from the electronic component in the data center to liquid in the first portion of the closed loop. The second area is configured for removing heat from the liquid in the second portion of the closed loop by receiving ambient air, which moves across the second portion, from outside the data center and configured for outputting the ambient air with the dissipated heat from the second area and the data center. The barrier is configured for preventing the ambient air from entering the first area.

15 Claims, 3 Drawing Sheets

(56) References Cited

U.S. PATENT DOCUMENTS

| | | | |
|---|---|---|---|
| 7,599,761 B2 | 10/2009 | Vinson et al. | |
| 7,660,121 B2 | 2/2010 | Campbell et al. | |
| 8,456,840 B1* | 6/2013 | Clidaras | H05K 7/20745 165/104.22 |
| 2004/0223300 A1* | 11/2004 | Fink | H05K 7/20 361/690 |
| 2005/0052848 A1 | 3/2005 | Hamman | |
| 2005/0081534 A1 | 4/2005 | Suzuki et al. | |
| 2005/0099775 A1 | 5/2005 | Pokharna | |
| 2006/0002086 A1* | 1/2006 | Teneketges | H01L 23/473 361/699 |
| 2006/0256526 A1* | 11/2006 | Hamman | G06F 1/20 361/699 |
| 2007/0201204 A1 | 8/2007 | Upadhya et al. | |
| 2007/0297136 A1* | 12/2007 | Konshak | H05K 7/20772 361/699 |
| 2008/0055850 A1* | 3/2008 | Carlson | G06F 1/20 361/695 |
| 2008/0204999 A1* | 8/2008 | Clidaras | H05K 7/20745 361/696 |
| 2008/0209931 A1* | 9/2008 | Stevens | H05K 7/20763 361/699 |
| 2008/0259566 A1* | 10/2008 | Fried | F28D 15/0266 361/699 |
| 2008/0291626 A1* | 11/2008 | Nelson | F24F 1/0059 361/696 |
| 2009/0059515 A1* | 3/2009 | Tsakanikas | G06F 1/18 361/679.49 |
| 2009/0073652 A1* | 3/2009 | Matser | H05K 7/20745 361/691 |
| 2009/0122483 A1 | 5/2009 | Hall | |
| 2009/0218078 A1* | 9/2009 | Brunschwiler | G06F 1/20 165/104.33 |
| 2009/0237883 A1 | 9/2009 | Wei | |
| 2009/0268404 A1 | 10/2009 | Chu | |
| 2010/0067193 A1 | 3/2010 | Arimillj et al. | |
| 2010/0103620 A1* | 4/2010 | Campbell | H05K 7/20772 361/702 |
| 2010/0149754 A1 | 6/2010 | Chapel et al. | |
| 2010/0259886 A1* | 10/2010 | Mongia | G06F 1/203 361/679.47 |
| 2010/0277863 A1* | 11/2010 | Tozer | H05K 7/20827 361/679.47 |
| 2010/0328883 A1* | 12/2010 | Ledezma | H02M 7/003 361/690 |
| 2010/0328888 A1* | 12/2010 | Campbell | H01L 23/4735 361/699 |
| 2011/0051372 A1* | 3/2011 | Barringer | H05K 7/20781 361/701 |
| 2011/0056674 A1* | 3/2011 | Campbell | H05K 7/20 165/247 |
| 2011/0105015 A1* | 5/2011 | Carlson | H05K 7/20127 454/253 |
| 2011/0292595 A1* | 12/2011 | El-Essawy | G06F 1/18 361/679.53 |
| 2012/0026691 A1* | 2/2012 | Campbell | H05K 7/20781 361/700 |
| 2012/0057302 A1* | 3/2012 | Wei | H05K 7/20781 361/699 |
| 2012/0176745 A1* | 7/2012 | Helberg | G06F 1/1632 361/679.47 |

OTHER PUBLICATIONS

Girish Upadhya, "Cooligy Active Micro-Structure Liquid Cooling System for Gamer PC Applications," Proceedings of ITHERM, Jun. 2006.

ISA, International Search Report, May 31, 2012, PCT/US2011/057874.

* cited by examiner

DEVICE FOR COOLING AN ELECTRONIC COMPONENT IN A DATA CENTER

BACKGROUND

Electronic components, such as processors and memory, among other things, produce heat. Heat can cause an electronic component to not perform correctly, corrupt data on the electronic component, or damage the electronic component, among other things. Therefore, various methods are used for removing the heat from the electronic component. The heat from the electronic devices dissipates into the data center's environment. Many data centers use air conditioners that cool air in the data center. The cooled air can be moved back inside of devices to cool the electronic components. However, using air conditions to cool the air is expensive. Further, a data center may have the computing power and the desire to deploy more electronic components than what their current air conditioning system can handle.

The drawings referred to in this Brief Description should not be understood as being drawn to scale unless specifically noted.

DESCRIPTION OF EMBODIMENTS

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in the following Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Figure 1:
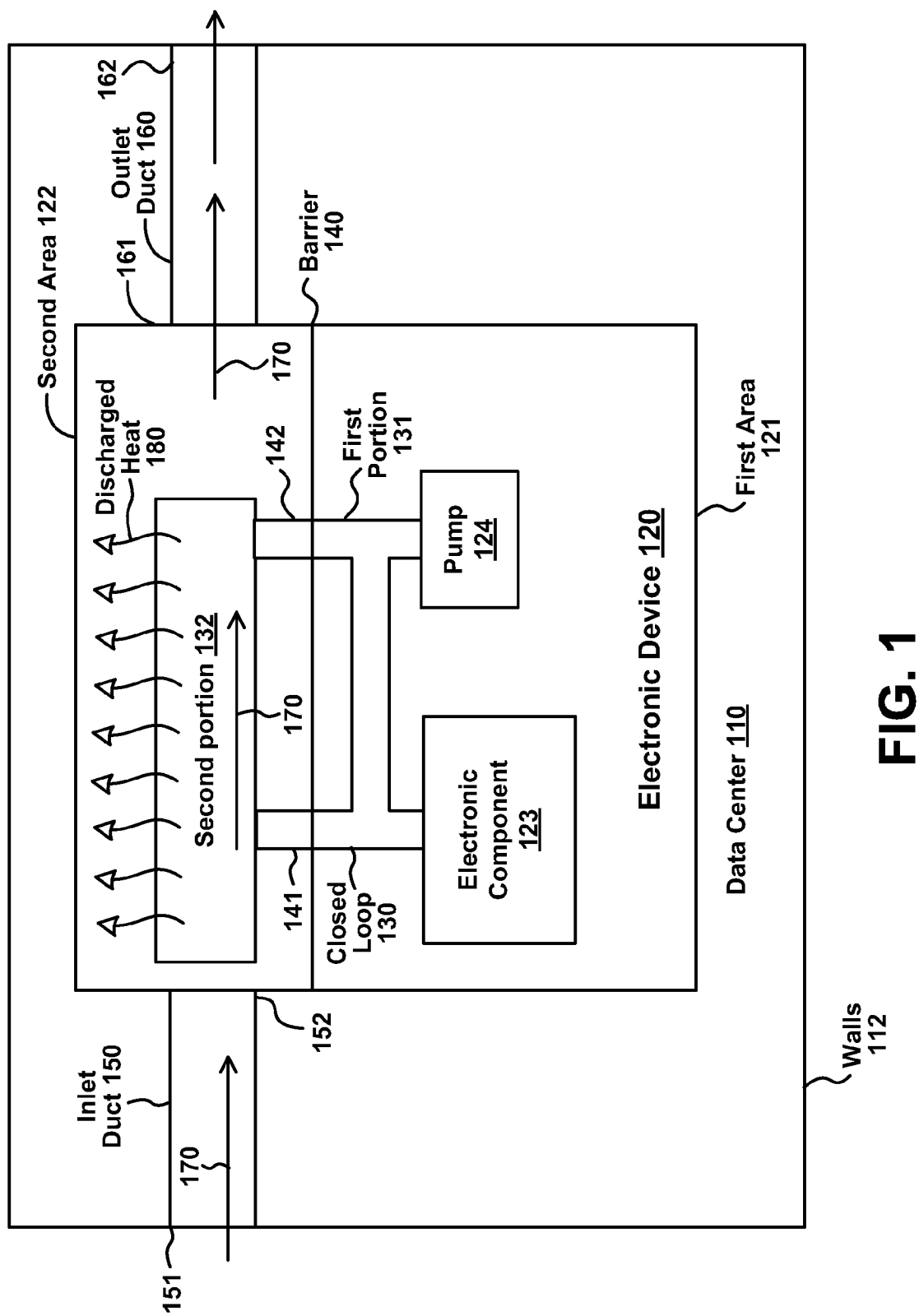
FIG. 1 depicts an electronic device for cooling an electronic component in a data center, according to one embodiment.

FIG. 1 depicts an electronic device 120 for cooling an electronic component 123 in a data center 110, according to one embodiment.

As depicted in FIG. 1, the device 120 includes a first area 121, a second area 122, a barrier 140, and a dosed loop 130. The first area 121 includes an electronic component 123 that produces heat. The second area 122 is configured for collecting the produced heat and configured for discharging 180 the produced heat. The barrier 140 is configured for physically separating the first area 121 and the second area 122. The barrier 140 restricts ambient air 170 to the second area 122 and prevents the ambient air 170 from entering the first area 121. FIG. 1 depicts the pump 124 in the first area 121. However, the pump 124 may reside in either the first area 121 or the second area 122.

The dosed loop 130 is configured for liquid to flow around the dosed loop 130. According to one embodiment, a pump 124 is used to move the liquid through the dosed loop 130. For example, the pump 124 causes cooled liquid to move through the closed bop 130. The liquid moves in proximity to the electronic component 123, moves from the first area 121 into the second area 122 through the barrier 140 at location 141, moves through the second area 122, moves out of the second area 122 and back into the first area 121 at location 142.

The closed loop 130 includes a first portion 131 and a second portion 132. The first portion 131 of the closed loop 130 is located in the first area 121 and a second portion 132 of the closed loop 130 is located in the second area 122. The first portion 131 of a closed loop 130 is configured for removing heat from the electronic component 123 that resides in the first area 121 and configured for moving the removed heat to the second area 122 using the liquid. For example, when the liquid in the first portion 131 of the closed loop 130 is in proximity to the electronic component 123, heat from the electronic component 123 dissipates from the electronic component 123 into the liquid. The pump 124 causes the heated liquid to move into the second portion 132 of the closed loop 130.

The second portion 132 of the closed bop 130 is configured for cooling the heated liquid by collecting the heat from the liquid in the second area 122 and is configured for discharging 180 the heat from the second area 122 and out of the data center 110 using the ambient air 170.

The second portion 132 of the closed loop 130 is configured for interfacing with data center 110 ducting which is separate from the device 120, according to one embodiment. For example, the device 120 is inside of a data center 110. The second portion 132 is coupled to the data center 110's ducting 150, 160. More specifically, the inlet duct 150 is coupled to the data center 110's wall 112 at location 151 and connected to the second area 122 at location 152. The outlet duct 160 is coupled to the second area 122 at location 161 and to the data center 110's wall 112 at location 162. Ambient air 170 can be provided to the second area 122 from outside of the data center 110 through the inlet duct 150. The ambient air 170 can move across the second portion 132 of the dosed loop 130 and then out of the second area 122 and out of the data center 110 through the outlet duct 160. The barrier 140 restricts the ambient air 170 to inside of the second area 122 and prevents the ambient air 170 from entering the first area 121. By receiving ambient air 170 through the inlet duct 150 from outside a data center, discharging ambient air 170 with discharged heat 180 to outside of the data center, and using a barrier 140 to restrict the ambient air 160 to inside of the second area 122, the ambient air 170, according to one embodiment, is prevented from entering the first area 121 as well as the data center.

When the liquid is in proximity to the electronic component 123, the heat is discharged from the electronic component 123 into the liquid. The pump 124 causes the heated liquid to move through the dosed loop 130 from the first portion 131 to the second portion 132 through the barrier 140 at location 141. When the heated liquid is in the second portion 132, the heat from the liquid is collected in the second area 122. The heat is discharged 180 from the second portion 132. For example, the ambient air 170 moves across the second portion 132 from the inlet duct 150 to the outlet duct 160 as indicated by the arrows. The liquid in the second portion 132 of the closed loop 130 is hotter than the ambient air 170 causing the heat to be discharged 180 from the liquid into the ambient air 170 inside of the second area 122. Discharging 180 the heat from the liquid into the ambient air 170 cools the liquid. The ambient air 170, with the discharged heat 180, moves out of the second portion 132 and then out of the data center 110 through the outlet duct 160.

The cooled liquid moves from the second portion 132 in the second area 122 to the first area 121 through the barrier 140 at location 142. The cooled liquid in the first area 121 can then be used again to remove additional heat from the electronic component 123 where the process of removing heat from the electronic component 123 to the liquid, cooling the liquid by dissipating the heat from the liquid into the ambient air 170, and then removing heat from the electronic component 123 to the liquid begins again.

According to one embodiment, the device 120 includes both the first area 121 and the second area 122. According to another embodiment, the device 120 includes the first area 121 but does not include the second area 122. In this case, the first area 121 is referred to as "an internal area" and the second area 122 is referred to as an "external area." In this case, dripless quick connects can be used for connecting the first portion 131 and the second portion 132 of the closed loop 130 at locations 141 and 142 as depicted in FIG. 1.

In the event that the device 120 does not include the second area 122, the ducts 150, 160 may be coupled directly to the sides of the second area 122, according to one embodiment. More specifically, a device 120, which only includes the first area 121 according to one embodiment, can be slid out the front and a new device 120 can be slid in from the front without the use of a rotatable door. As will become more evident, the second area 122 may be a part of the device 120 and a rotatable door can be used as a part of removing the device 120 and inserting a new device 120.

The electronic component 123 may be any number of different types of electronic components 123. For example, the electronic component 123 may be a processor, storage, a switch, an I/O controller, among other things. The device 120 may be a server. Further, the device 120 may be a part of a rack. The device 120 may include more than one electronic component 123 that is cooled by the closed loop 130, according to various embodiments.

According to one embodiment, at least a portion of the data center 110's air duct is oriented horizontally. However, embodiments are well suited for the data center 110's air ducts to be oriented vertically providing, at least in part, a chimney effect. More specifically, the device 120 may include a chimney, for example, through the center of the device 120, which is connected with data center 110 ducting which may also be oriented vertically. Portions of the data center 110's air duct may be oriented horizontally and other portions of the data center 110's air duct may be oriented vertically. The data center 110's air ducts may be oriented so that they go around other devices in the data center 110.

According to one embodiment, the ambient air 170 is prevented from coming into contact with electronic components. For example, the ambient air 170 is restricted to the data center 110's air ducts and the second area 122. Therefore, the ambient air 170 can be used to cool electronic components 123, according to various embodiments, while not being allowed to come into contact with those electronic components 123 or any other electronic components associated with a data center 110, regardless of whether the electronic components are associated with a device 120.

According to one embodiment, one or more fans are used to move the ambient air 170. For example, referring to FIG. 1, a fan may be positioned at location 151 or location 162 at the walls 112 of the data center 110. According to one embodiment, one fan is used that is positioned at either location 151 or location 152. However, more than one fan can be used.

According to one embodiment, a filter can be used to remove contaminants from the ambient air 170 before it enters the second area 122. For example, a filter may be positioned at location 151 depicted in FIG. 1.

Figure 2:
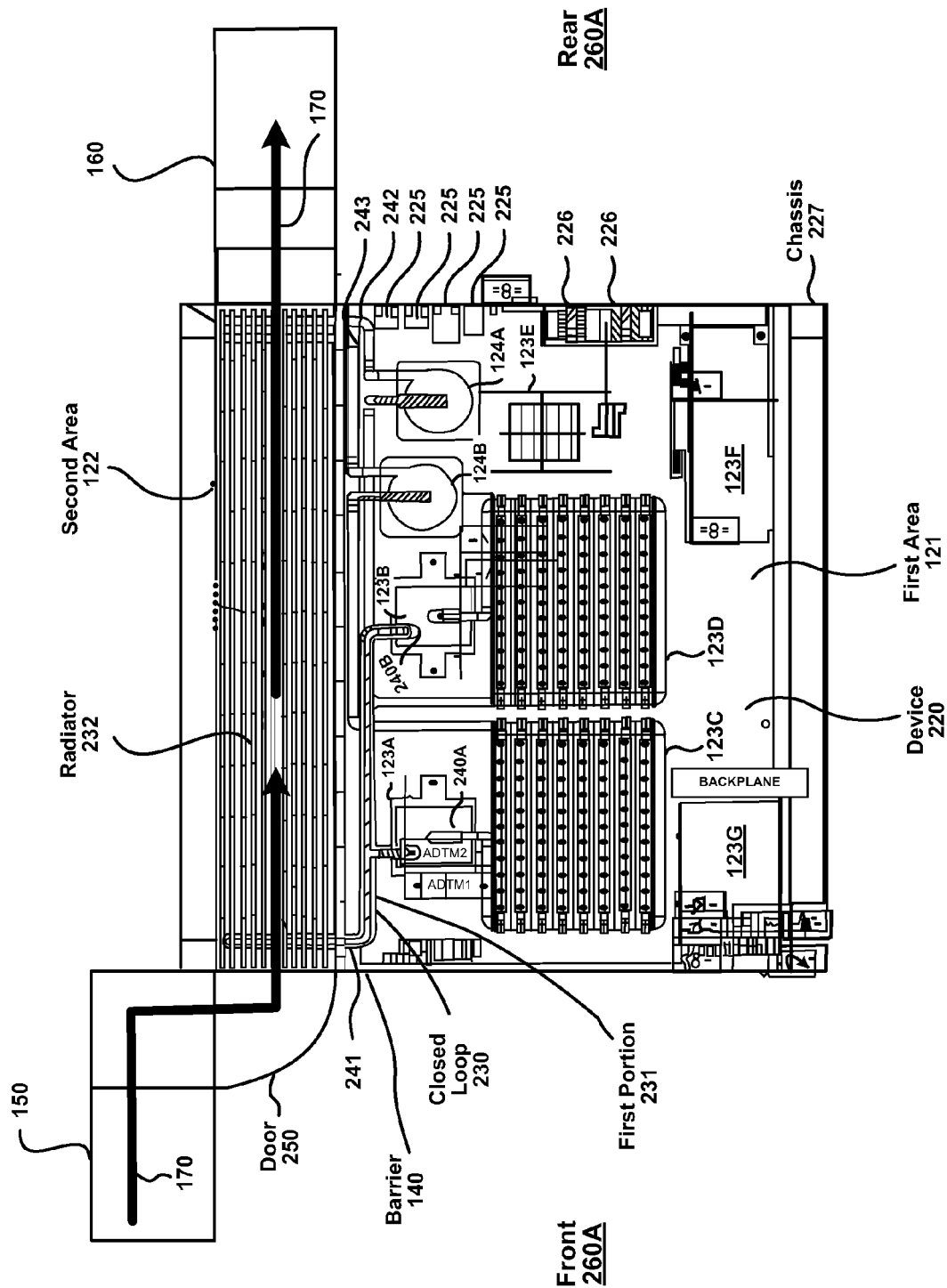
FIG. 2 depicts an electronic device for cooling an electronic component in a data center, according to another embodiment.

FIG. 2 depicts an electronic device for cooling an electronic component in a data center, according to another embodiment. As depicted in FIG. 2, the device 220 is a server.

The first area 121 of the device 220 includes various electronic components, such as two processors 123A, 123B, two pumps 124A, 124B, two on board storage devices 220, hot swappable memory 123G, an I/O card 123F, an I/O controller 123E, various input output connections 225, and auxiliary fans 226. Examples of input and output connections 225 include, but are not limited to, network interface cards (NICS), Input Output (I/O) ports, Universal Serial Bus (USB) ports, among others.

As depicted in FIG. 2, the first area 121 is also referred to as a device 220. The second area 122 may or may not be a part of the device 220. The second area 122 includes a second portion of the closed loop 230, which according to one embodiment, is a radiator 232.

According to one embodiment, the closed loop 230 includes a first portion 231 and a second portion 232. The first portion 231 includes the tubes that are connected to the pumps 124A, 124B, the on board memory 123C, 123D, and the processors 123A, 123B depicted in the first area 121. The term "liquid loop" can be used to refer to the first portion 231 or may be used to refer to the first portion 231 and tubes that run through and are a part of the second portion 232, according to one embodiment. The second portion 232 is provided by the radiator 232 in the second area 122, according to one embodiment. Various embodiments are well suited for any type of liquid loop; therefore, a particular type of liquid loop is not required.

According to one embodiment, cold plates may be associated with an electronic component. For example, FIG. 2 depicts cold plates 240A, 240B on top of the processors 123A, and 123B. Cold plates may be associated with other electronic components, such as the on board memory 123C, 123D, the I/O controller 123E, the I/O card 123F, among others.

The liquid is heated as it moves from the first pump 124A to the first on board memory 123D to the first processor 123B and then through the barrier 140 at location 241. The liquid is also heated as it moves from the second pump 124B to the second on board memory 123C to the second processor 123A and then through the barrier 140 at location 241. The liquid is cooled as it moves through the radiator 232 dissipating heat from the liquid into the ambient air 170 that moves over the radiator 232. The cooled liquid then reenters the first area 121 at locations 242 and 243 where it moves into the first pump 124A from location 242 and into the second pump 124B from location 243. The process of heating the liquid starts again. The closed loop 230 can also be used to cool other components, such as the on board memory 123C, 123D, the I/O controller 123E, and the I/O card 123F, among others.

According to one embodiment, the device 220 includes low power auxiliary fans 226 to cool electronic components that are not cooled with the dosed loop 230. For example, as depicted in FIG. 2, the auxiliary fans 226 are used to cod the I/O controller 123E, the hot swappable memory 123G and the I/O card 123F, among other things. However, embodiments are well suited for coding these components with the dosed loop 230 instead.

According to one embodiment, easy access to input output connections 225 is provided. For example, as depicted in FIG. 2, the input output connections 225 are located toward the rear 260B of the device 220. According to one embodiment, the input output connections 225 are exposed for easy access.

According to one embodiment, the second area 122 is configured to interface with the data center's ducts 150, 160. For example, a rotatable door 250 may be used for coupling and decoupling the second area 122 from the ducting 150. More specifically, the rotatable door 250 may be rotated dock wise into the ducting 150 enabling a device 220 to be slid out the front 260A of the chassis 227 and enabling a new device 220 to be slide into the front 260A of the chassis 227. Then the rotatable door 250 can be rotated back counter dock wise.

Figure 3:
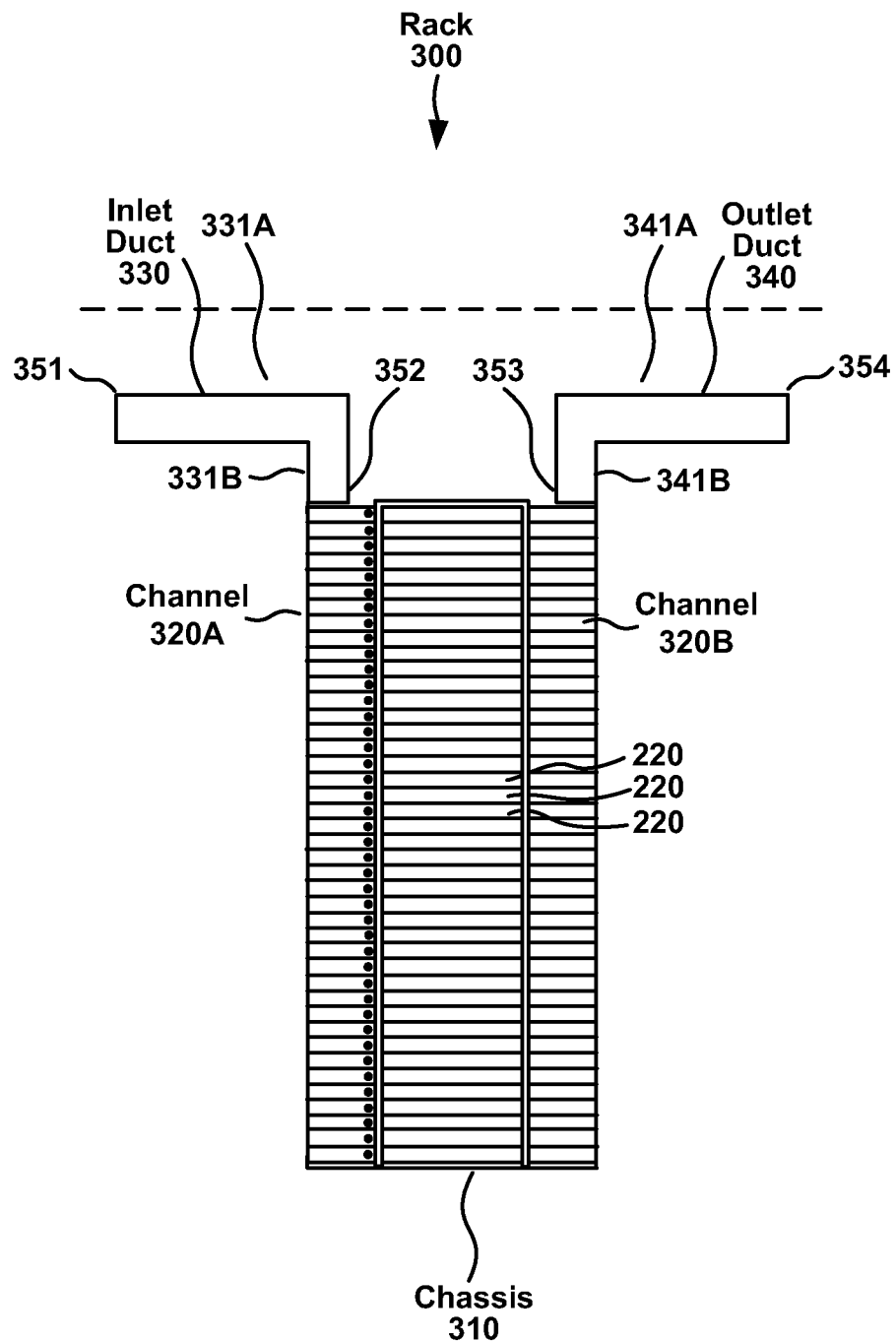
FIG. 3 depicts a rack that includes multiple electronic devices, according to one embodiment.

FIG. 3 depicts a rack 300 that includes multiple electronic devices 220, according to one embodiment. A device 220 may be easily slid in and out of the rack 300's chassis 310 as discussed herein. The rack 300's chassis 310 also includes two channels 320A, 320B, which are positioned one on each side of the chassis 310. The channel 320A, which is coupled with the inlet duct 330, enables air to move from outside of the data center into the second areas associated with each of the devices 220. The channel 320B, which is coupled to the outlet duct 340, enables ambient air to move out of the second areas associated with each of the devices 220 and out of the data center.

Further, as depicted in FIG. 3, both the inlet duct 330 and the outlet duct 340 have respective portions 331A, 341A that are horizontal and respective portions 331B, 341B that are vertical. The horizontal portions 331A, 341A are connected to the data center's was and the vertical portions 331B, 341B are connected to the rack 300's channels 320A, 320B. More specifically, the inlet duct 330 is connected to the data center's wall at location 351 and the outlet duct 340 is connected to the data center's wall at location 354. The inlet duct 330 is connected to the device 220 at location 352 and the outlet duct 340 is connected to the channel 320A at location 353.

According to one embodiment, specific air conditions are not required. For example, since ambient air is used, according to various embodiments, the air is not required to meet certain standards for cleanliness, humidity, or temperature, among other things.

Various embodiments do not require heat to be moved across a component that the heat has been removed from. For example, embodiments provide for using a closed loop 130, 230 to remove heat from electronic components 123 (FIG. 1) 123A, 123B, 123C, 123D (FIG. 2). The heat that is removed from those components 123 (FIG. 1) 123A, 123B, 123C, 123D (FIG. 2) is not required to move over those same components 123 (FIG. 1) 123A, 123B, 123C, 123D (FIG. 2) or any other component 123E, 123G, 123F (FIG. 2) in the data center. According to one embodiment, auxiliary fans 226 (FIG. 2) can be used to remove at least a portion of heat from some components 123E, 123G, 123F (FIG. 2). For example, auxiliary fans 226 (FIG. 2) can be used to remove heat from the hot swappable memory 123G, the I/O controller 123E, or I/O card 123F. In this case, the heat from the hot swappable memory 123G, the I/O controller 123E, and the I/O card 123F will move across electronic components 123A-123F (FIG. 2). However, as discussed herein, the closed loop 130, 230 can also be associated with the additional electronic components, such as the hot swappable memory 123G, the I/O controller 123E and the I/O card 123F and the auxiliary fans 226 can be eliminated. Therefore, various embodiments, do not require the auxiliary fans 226 (FIG. 2), thus, providing for the elimination of moving discharged heat, which has been removed using various embodiments, across internal components 123A-123F.

According to one embodiment, chimney effect is not used. According to one embodiment, chimney effect is not required. For example, according to one embodiment, at least a part of the data center's air ducts are oriented horizontally. Further, according to one embodiment, at least one fan, which is located for example at location 151 or 162 in FIG. 1, is used for moving the ambient air.

Although various embodiments have been described in the context of a barrier that is linear, various embodiments are well suited for a barrier that is not linear. For example, a non-linear barrier may be used to enable a chimney to be associated with the second area where heat is enabled to rise straight up. According to another embodiment, a chimney may be provided in combination with a linear barrier.

According to one embodiment, heat is removed without the use of a heat sink or without requiring a heat sink.

Various embodiments do not require the data center's air condition system to cool the air down so that it can be moved back in to the device to cool an electronic component, thus, providing for additional computing capabilities without significantly increasing the load on the data center's air conditioning system.

Example embodiments of the subject matter are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

Various embodiments have been described in various combinations and illustrations. However, any two or more embodiments or features may be combined. Further, any embodiment or feature may be used separately from any other embodiment or feature. Phrases, such as "an embodiment," "one embodiment," among others, used herein, are not necessarily referring to the same embodiment. Features, structures, or characteristics of any embodiment may be combined in any suitable manner with one or more other features, structures, or characteristics.

What is claimed is:

1. A device for cooling an electronic component in a data center, the device comprising:
    a closed loop that includes a first portion and a second portion, wherein liquid flows around the closed loop;
    a first area configured for dissipating heat from the electronic component in the data center to liquid in the first portion of the closed loop;
    a second area configured for removing heat from the liquid in the second portion of the closed loop by receiving ambient air, which moves across the second portion, from outside the data center and configured for outputting the ambient air with the dissipated heat from the second area and the data center; and
    a barrier between the first area and the second area configured for preventing the ambient air from entering the first area, and configured for allowing the liquid to flow through the barrier between the first area and the second area.

2. The device of claim 1, wherein the device further comprises a pump configured for moving the liquid around the closed loop.

3. The device of claim 1, wherein the second portion of the closed loop is a radiator.

4. The device of claim 1, wherein the device further comprises:
    a second electronic component that is not cooled by the liquid of the closed loop; and an auxiliary fan for cooling the second electronic component.

5. The device of claim 1, wherein the device further comprises a cold plate that is positioned over the electronic component.

6. The device of claim 1, wherein the second area is configured for coupling and decoupling the second area from a duct of the data center using a rotatable door.

7. The device of claim 1, wherein the second area is configured for coupling with a first channel of a chassis to receive the ambient air and configured for coupling with a second channel of the chassis to output the ambient air and the dissipated heat.

8. A device for cooling an electronic component in a data center, the device comprising:
- a first portion of a closed loop that is configured for connecting with a second portion of the closed loop, wherein the second portion is external to the device and the closed loop is configured for liquid to flow around the closed loop when the first portion and the second portion are connected;
- a first area configured for dissipating heat from the electronic component in the data center to liquid in the first portion of the closed loop and configured for interfacing with a second area that is external to the device, wherein the second area is configured for removing heat from the liquid in the second portion of the closed loop by receiving ambient air, which moves across the second portion, from outside of the data center and configured for outputting the ambient air with the dissipated heat from the second area and the data center; and
- a barrier between the first area and the second area configured for preventing the ambient air from entering the first area, and configured for allowing the liquid to flow through the barrier between the first area and the second area.

9. The device of claim 8, wherein the device further comprises dripless quick connects for connecting and disconnecting the first portion with the second portion of the closed loop.

10. The device of claim 8, wherein the second area includes a vertical chimney.

11. A device for cooling an electronic component in a data center, the device comprising:
- an electronic component that produces heat;
- a liquid loop configured for removing the heat produced by the electronic component;
- a radiator configured for discharging the heat from the liquid loop using ambient air obtained from outside of the data center, wherein the ambient air moves across the radiator; and
- a physical barrier for separating a first area and a second area of the device, wherein the ambient air is provided to the second area and restricted from entering the first area and the data center, and wherein the electronic component and at least a portion of the liquid loop reside in the first area and the radiator resides in the second area, and wherein the physical barrier is configured for allowing liquid in the liquid loop to flow through the physical barrier between the first area and the second area.

12. The device of claim 11, wherein the device further comprises a pump configured for moving the liquid around the loop.

13. The device of claim 11, wherein the device further comprises a cold plate that is positioned over the electronic component.

14. The device of claim 11, wherein the device further comprises:
- a second electronic component that is not cooled by the liquid of the loop; and
- an auxiliary fan for cooling the second electronic component.

15. The device of claim 11, wherein the second area is configured for coupling and decoupling the second area from a duct of the data center using a rotatable door.

* * * * *